United States Patent
Fox et al.

(10) Patent No.: US 10,404,223 B2
(45) Date of Patent: Sep. 3, 2019

(54) FREQUENCY RE-BANDER WITH UE AND POWER EFFICIENCY FEATURES

(71) Applicant: Cubic Corporation, San Diego, CA (US)

(72) Inventors: Andrew John Fox, Chippenham (GB); Matthew Parry, Chippenham (GB)

(73) Assignee: Cubic Corporation, San Diego, CA (US)

(*) Notice: Subject to any disclaimer, the term of this patent is extended or adjusted under 35 U.S.C. 154(b) by 0 days.

(21) Appl. No.: 16/250,589

(22) Filed: Jan. 17, 2019

(65) Prior Publication Data

US 2019/0222180 A1  Jul. 18, 2019

Related U.S. Application Data

(60) Provisional application No. 62/618,375, filed on Jan. 17, 2018.

(51) Int. Cl.
| | |
|---|---|
| *H03G 3/30* | (2006.01) |
| *H03F 1/56* | (2006.01) |
| *H03F 3/24* | (2006.01) |
| *H04B 1/16* | (2006.01) |
| *H04L 5/14* | (2006.01) |

(52) U.S. Cl.
CPC .............. *H03F 1/56* (2013.01); *H03F 3/24* (2013.01); *H04B 1/1615* (2013.01); *H04L 5/14* (2013.01); *H03F 2200/451* (2013.01)

(58) Field of Classification Search
CPC ........................................................ H03G 3/30
USPC ................................................... 330/278, 279
See application file for complete search history.

(56) References Cited

U.S. PATENT DOCUMENTS

| | | | | |
|---|---|---|---|---|
| 6,243,399 | B1* | 6/2001 | Kaewell | H04B 1/036 370/525 |
| 6,728,523 | B1 | 4/2004 | Ohba | |
| 7,289,574 | B2* | 10/2007 | Parolari | H04L 1/0003 375/259 |
| 9,084,128 | B2* | 7/2015 | Mujtaba | H04W 68/00 |
| 2010/0105340 | A1 | 4/2010 | Weissman | |
| 2011/0189949 | A1 | 8/2011 | Fox et al. | |

FOREIGN PATENT DOCUMENTS

| | | |
|---|---|---|
| EP | 1051638 A1 | 11/2000 |
| WO | 96/28905 A1 | 9/1996 |

OTHER PUBLICATIONS

International Search Report and Written Opinion dated May 6, 2019 in related PCT application No. PCT/US2019/014008, 15 pgs.

* cited by examiner

*Primary Examiner* — Henry Choe
(74) *Attorney, Agent, or Firm* — Kilpatrick Townsend & Stockton, LLP

(57) ABSTRACT

Techniques are provided herein for providing power efficiency for re-bander units. In particular, embodiments may provide for powering up of a power amplifier in the transmit path of the re-bander on demand, when a transmit signal is to be transmitted. Circuitry controlling the powering up of the power amplifier may do so based on a transmit indicator signal, indicating the presence of a transmit signal received by the re-bander unit. The transmit indicator signal may be a strobe signal received by a user equipment (UE) to which the re-bander unit is coupled, or may be derived from detection of the transmit signal by a directional coupler and power detector.

20 Claims, 5 Drawing Sheets

FREQUENCY RE-BANDER WITH UE AND POWER EFFICIENCY FEATURES

CROSS-REFERENCES TO RELATED APPLICATIONS

The present application claims the benefit under 35 USC § 119(e) of U.S. Provisional Application No. 62/618,375, filed on Jan. 17, 2018, entitled "Frequency Re-Bander with UE and Power Efficiency Features," which is incorporated by reference herein in its entirety.

BACKGROUND

There are many applications where having an ability to deploy a wide area network (WAN) that employs data communication technologies (such as Long-Term Evolution (LTE)), in any available spectrum is highly desirable. Such applications can include, for example, WAN deployments in new/emerging markets, military and/or other non-civilian applications, deployment in regions in which traditional cellular frequencies may not be desirable (due to physical and/or electronic interference, etc.) and the like. The utilization of frequency "re-banding" technology allows for the creation of a data communication network that uses established data communication technologies on any available spectrum. Traditional re-bander units, however, require a relatively significant power usage. This can be problematic for mobile applications in which units are powered by battery.

BRIEF SUMMARY

Techniques are provided herein for providing power efficiency for re-bander units. In particular, embodiments may provide for powering up of a power amplifier in the transmit path of the re-bander on demand, when a transmit signal is to be transmitted. Circuitry controlling the powering up of the power amplifier may do so based on a transmit indicator signal, indicating the presence of a transmit signal received by the re-bander unit. The transmit indicator signal may be a strobe signal received by a user equipment (UE) to which the re-bander unit is coupled, or may be derived from detection of the transmit signal by a directional coupler and power detector.

An example frequency re-bander unit, according to the description, comprises an interface configured to receive a transmit signal from a user equipment (UE); re-banding circuitry comprising an input configured to receive the transmit signal from the interface, and an output configured to provide a re-banded transmit signal by altering a transmit frequency of the transmit signal; control circuitry comprising an input configured to receive a transmit indicator signal indicative of receipt of the transmit signal from the UE at the interface, and an output configured to provide, in response to receiving the transmit indicator signal, an activation signal configured to cause a power amplifier to transition from an inactive state to an active state; and the power amplifier comprising an input coupled with an output of the re-banding circuitry and configured to receive, while in the active state, the re-banded transmit signal, and an output configured to provide, while in the active state, an amplified re-banded transmit signal for wireless transmission by an antenna. The power amplifier is configured to transition from the active state to the inactive state after the amplified re-banded transmit signal is transmitted, and use less power in the inactive state than when the power amplifier is in the active state.

Alternative embodiments of the frequency re-bander unit may further comprise one or more of the following features. The control circuitry may be configured to receive the transmit indicator signal from the UE, where the transmit indicator signal comprises a strobe signal. The frequency re-bander unit may further comprise a directional coupler coupled between the interface and the re-banding circuitry and configured to detect the transmit signal, wherein the directional coupler comprises an output configured to provide, in response to detecting the transmit signal, a detection signal; and power detector circuitry, coupled between the directional coupler and the input of the control circuitry, the power detector circuitry comprising an input configured to receive the detection signal, and an output configured to provide the transmit indicator signal to the control circuitry in response to receiving the detection signal. The activation signal may be configured to cause the power amplifier to transition from the inactive state to the active state at least in part by causing a gain increase of the power amplifier, providing an enable signal at an enable input of the power amplifier, or causing power circuitry to provide power to the power amplifier, or any combination thereof. The control circuitry may comprise a processor. The frequency re-bander unit may further comprise a first delay block coupled between the interface and the input of the re-banding circuitry, wherein the first delay block is configured to delay the receipt of the transmit signal at the input of the re-banding circuitry; or a second delay block coupled between the output of the re-banding circuitry and the input of the power amplifier, where the second delay block is configured to delay the receipt of the re-banded transmit signal at the input of the power amplifier; or both. The control circuitry may further comprise a second output configured to provide, in response to receiving the transmit indicator signal, a second activation signal configured to cause the re-banding circuitry to transition from an inoperable state to an operable state. The re-banding circuitry may also be configured to provide the re-banded transmit signal at the output of the re-banding circuitry while in the operable state, transition from the operable state to the inoperable state after the re-banded transmit signal is provided, and use less power in the inoperable state than when the re-banding circuitry is in the operable state. The frequency re-bander unit may further comprise receive circuitry comprising an input configured to receive a receive signal detected with the antenna, and an output configured to provide a re-banded receive signal by altering a received frequency of the received signal; a de-duplexer coupled with the interface, the output of the receive circuitry, and the input of the re-banding circuitry, wherein the de-duplexer is configured to route the re-banded receive signal to the UE via the interface, and route the transmit signal, received from the UE at the interface, to the input of the re-banding circuitry; and a duplexer coupled with an antenna, the output of the power amplifier, and the input of the receive circuitry, wherein the duplexer is configured to route the receive signal from the antenna to the input of the receive circuitry, and route the amplified re-banded transmit signal from the output of the power amplifier to the antenna. The duplexer may be configured to switch between a transmit mode or receive mode to provide Time Division Duplex (TDD) operability, and the control circuitry may further comprise a second output configured to provide, in response to receiving the transmit indicator signal, a second activation signal configured to cause the duplexer to switch from the receive mode to a transmit mode; and the duplexer may be configured to route the amplified re-banded transmit signal from the output of the power amplifier to the antenna while in the transmit mode, and switch from the transmit mode to the receive mode after routing the amplified re-banded transmit signal to the antenna. The de-duplexer maybe configured to switch between a transmit mode or receive mode to provide TDD operability such that the de-duplexer routes the re-banded receive signal to the UE via the interface while in the receive mode, routes the transmit signal to the input of the re-banding circuitry while in the transmit mode, and switches from the transmit mode to the receive mode routing the transmit signal to the input of the re-banding circuitry.

An example method of performing power-efficient frequency re-banding of a transmit signal, according to the description, comprises receiving, at a re-bander unit, the transmit signal from a user equipment (UE); generating a re-banded transmit signal by altering a transmit frequency of the transmit signal; receiving a transmit indicator signal indicative of receipt of the transmit signal at the re-bander unit; in response to receiving the transmit indicator signal, causing a power amplifier of the re-bander unit to transition from an inactive state to an active state prior to the power amplifier receiving the re-banded transmit signal; generating an amplified re-banded transmit signal at least in part by amplifying the re-banded transmit signal with the power amplifier while the power amplifier is in the active state; providing the amplified re-banded transmit signal to an antenna for wireless transmission; and causing the power amplifier to transition from the active state to the inactive state after the amplified re-banded transmit signal is transmitted, wherein the power amplifier uses less power in the inactive state than when the power amplifier is in the active state.

Alternative embodiments of the method may include one or more of the following features. The transmit indicator signal may comprise a strobe signal received by the re-bander unit from the UE. The method may further comprise generating, with a directional coupler of the re-bander unit, a detection signal in response to detecting the transmit signal at the re-bander unit; and in response to receiving the detection signal at a power detector of the re-bander unit, generating the transmit indicator signal with the power detector. Causing a power amplifier of the re-bander unit to transition from an inactive state to an active state may comprise causing the power amplifier to transition from the inactive state to the active state at least in part by causing a gain increase of the power amplifier, providing an enable signal at an enable input of the power amplifier, or causing power circuitry to provide power to the power amplifier, or any combination thereof. The method may further comprise causing the power amplifier of the re-bander unit to transition from an inactive state to an active state using a processor. The method may further comprise using one or more delay blocks to delay the transmit signal, or delay the re-banded transmit signal, or the both. The re-bander unit may comprise re-banding circuitry that generates the re-banded transmit signal, and the method may further comprise, in response to receiving the transmit indicator signal, causing the re-banding circuitry to transition from an inoperable state to an operable state, wherein the re-banding circuitry generates the re-banded transmit signal while in the operable state, transitions from the operable state to the inoperable state after the re-banded transmit signal is generated, and uses less power in the inoperable state than when the re-banding circuitry is in the operable state. The method may further comprise receiving a receive signal detected with the antenna, generating a re-banded receive signal by altering a received frequency of the received signal, and routing the re-banded receive signal to the UE. The method may further comprise, in response to receiving the transmit indicator signal, causing a duplexer of the re-bander unit to switch from a receive mode to a transmit mode, wherein the duplexer is configured to route the amplified re-banded transmit signal from the power amplifier to the antenna while in the transmit mode, and switch from the transmit mode to the receive mode after routing the amplified re-banded transmit signal to the antenna. The re-bander unit may further comprise a de-duplexer that switches between a transmit mode or receive mode to provide TDD operability such that the de-duplexer routes a re-banded receive signal to the UE while in the receive mode, routes the transmit signal to re-banding circuitry of the re-bander unit while in the transmit mode, and switches from the transmit mode to the receive mode after routing the transmit signal to the re-banding circuitry.

BRIEF DESCRIPTION OF THE DRAWINGS

For a more complete understanding of this invention, reference is now made to the following detailed description of the embodiments as illustrated in the accompanying drawings, in which like reference designations represent like features throughout the several views and wherein.

In the appended figures, similar components and/or features may have the same reference label. Further, various components of the same type may be distinguished by following the reference label by a dash and a second label that distinguishes among the similar components. If only the first reference label is used in the specification, the description is applicable to any or all of the similar components having the same first reference label, irrespective of the second reference label.

DETAILED DESCRIPTION OF THE INVENTION

The ensuing description provides embodiments only, and is not intended to limit the scope, applicability or configuration of the disclosure. Rather, the ensuing description of the embodiments will provide those skilled in the art with an enabling description for implementing an embodiment. It is understood that various changes may be made in the function and arrangement of elements without departing from the scope.

It can be noted that, although embodiments and terminology provided herein are in reference to LTE or other mobile communication technology, other wireless technologies can be used in addition or as an alternative to LTE to communicate with a wide area network (WAN) or other digital communication network. These technologies can include, for example, fifth-generation (5G) New Radio (NR) or Nth Generation (NG) wireless standards and protocols. A person of ordinary skill in the art will appreciate that such standards evolve, and that new equivalent standards may take their place.

It can be further noted that embodiments provided herein can be utilized for Time Division Duplex (TDD) and/or Frequency Division Duplex (FDD) operability, depending on desired functionality. Moreover, the terms "duplexing" and "de-duplexing" and variants thereof used herein are used generically, and may apply to both active switching (TDD) and passive duplexing/de-duplexing (FDD).

Additionally, as used, the term "transmit signal" is used to describe a signal to be transmitted provided by the UE to a re-bander unit. Conversely, the term "received signal" is used to describe signal detected by an antenna, to be provided by the re-bander unit to the UE after re-banding.

Figure 1:
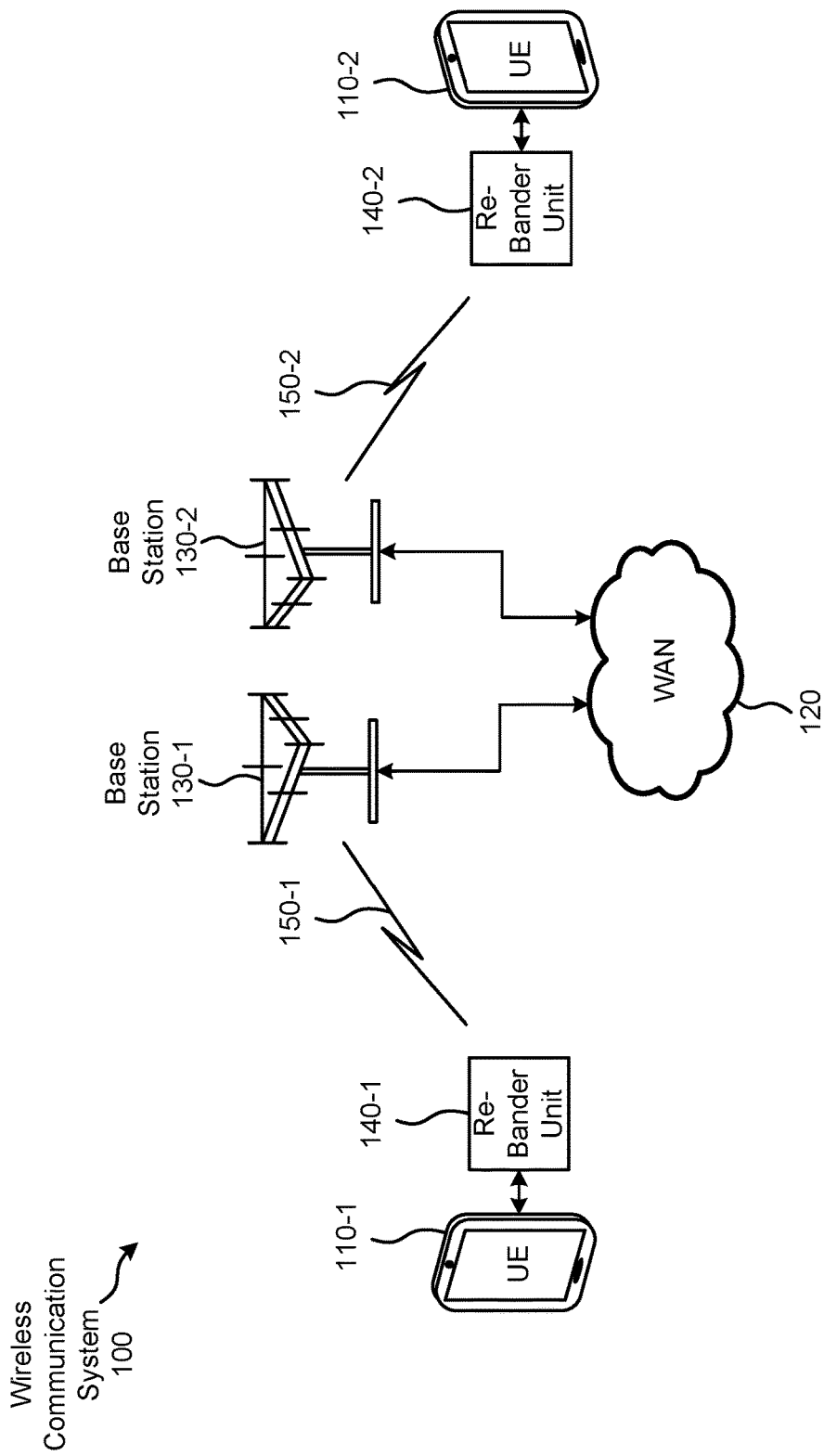
FIG. 1 is a simplified illustration of a wireless communication system, according to an embodiment.

FIG. 1 is a simplified illustration of a wireless communication system 100, according to an embodiment. As discussed herein below, the wireless communication system 100 may be capable of providing communication (e.g. voice and/or data) between UEs 110 connected with a WAN 120 via base stations 130.

It can be noted that, to avoid clutter, the wireless communication system 100 includes only two UEs 110 and two base stations 130. However, a person of ordinary skill in the art will appreciate that some embodiments may have any number of UEs 110 and/or base stations 130, and that the number of UEs 110 may be different than the number of base stations 130. For example, in a given operational environment, the wireless communication system 100 may comprise dozens, hundreds, or even thousands (or more) of UEs 110. Moreover, embodiments additionally or alternatively may include any number of base stations 130.

In brief, the wireless communication system 100 may be deployed similarly to a traditional mobile communication network and may be able to communicate using high-bandwidth mobile communication standards, such as LTE or other cellular technologies, thereby giving the wireless communication system a very high throughput capacity, relative to other wireless communication techniques. As opposed to a traditional mobile communication network, however, the wireless communication system 100 employs re-bander units 140 that enable UEs 110 designed for use with traditional mobile communication networks to communicate using frequencies that may not be used in the traditional mobile communication networks. As used herein, the term "wireless communication frequency" refers to the frequency band(s) of the wireless signals 150 used by the re-bander units 140 to communicate with the base stations 130. Conversely, the term "UE communication frequency" refers to the frequency band(s) used by the UEs 110 natively.

Such a re-banding may be applied in a variety of applications. For example, military organizations often use Mobile Ad hoc NETworks (MANETs), which may be deployed in an area in which a traditional mobile communication network is not available, or in which it is not desirable to use such a network. These MANETs often use non-commercial frequency bands, such as the "L" band (1.3 GHz) or the "H" band (2.2 GHz). However, because of the ubiquity and high-bandwidth nature of mobile communication technologies, it may be desirable to utilize Commercial Off-The-Shelf (COTS) UEs 110 in a wireless communication system 100. But because COTS UEs 110 do not communicate in the desired non-commercial frequencies (e.g., frequency bands used by the military), re-bander units 140 may be utilized to provide this functionality, enabling communication in the desired wireless communication frequencies rather than the UE communication frequency in which the COTS UEs 110 would natively communicate (e.g., commercial frequency bands).

Embodiments of re-bander units 140 are described in more detail below, with regard to FIGS. 2-4. In brief, a re-bander unit 140 may receive transmit signals from the UE 110 via an antenna port of the UE 110. Rather than transmit the received transmit signal at the UE communication frequency provided by the UE 110, the re-bander unit 140 includes re-banding circuitry that converts the frequency of the transmit signal to a re-banded transmit signal having the desired wireless communication frequency, different than the UE communication frequency. The re-banded transmit signal is then communicated wirelessly (via wireless signal 150). Similar process happens in reverse, where the re-bander unit 140 may receive wireless signals 150 at the desired wireless communication frequency, then re-band the received signal to the UE communication frequency used natively by the UE 110, then provide the re-banded received signal to the UE 110. In this way, the re-bander unit 140 may operate transparently to the UE 110. Moreover, as the underlying communication technology (e.g., LTE) improves, the re-bander units 140 may be used with improved/upgraded equipment, thereby reducing the cost to make system upgrades (where costs are due to improved/upgraded COTS equipment rather improved/upgraded specialized equipment that utilize the desired frequencies).

More broadly, a first UE 110-1 connected to the WAN 120 via a first base station 130-1 may send and receive wireless communications 150-1 at a wireless communication frequency (different from the UE communication frequency) by using the first re-bander unit 140-1. The first base station 130-1 operates to relay communications between the WAN 120 and the first UE 110-1. Similarly, a second UE 110-2 connected to the WAN 120 via a second base station 130-2 may send and receive wireless communications 150-2 at a wireless communication frequency using the second re-bander unit 140-2. The second base station 130-2 operates to relay communications between the WAN 120 and the second UE 110-2. In this way, the UEs 110 may communicate with each other and other UEs (not shown) via the WAN 120 using wireless signals 150 of different frequencies than the native frequencies used by the respective UEs 110.

It can be noted that any of a variety of variations may be implemented in a wireless communication system 100, depending on desired functionality. For example, base stations 130 may also utilize re-bander units in a similar manner as UEs 110. That is, base stations may communicate wirelessly via respective re-bander units that convert wireless signals 150 to frequencies utilized natively by the base stations 130. In this way, commercial base stations may be used which, similar to COTS UEs 110, may be cheaper than alternatives. In LTE, for example, a base station 130 may comprise an Evolved Node B (or eNodeB or eNB). In 5G, a base station 130 may comprise a 5G NR base station (gone or gNB).

The WAN 120 may comprise any of a variety of communication networks. As discussed in the example above, a WAN 120 may comprise an ad hoc network. Additionally or alternatively, the WAN 120 may comprise a traditional mobile communication network (which may, as explained above, use commercial base stations 130). The WAN 120 may additionally or alternatively comprise and/or be connected with any variety of network types, including private networks, public networks (e.g., the Internet), and/or other networks that may utilize any of a variety of wired and/or wireless communication technologies. As such, UEs 110 connected to the wireless communication system 100 may be able to communicate with other devices communicatively coupled with the WAN 120 via the Internet or other networks.

The re-bander unit 140 may come in a variety of form factors, departing on desired functionality. For example, the re-bander unit 140 may come in a form factor that couples easily to the body of the UE 110, enabling users to treat the UE 110 and re-bander unit 140 as a single physical device. The re-bander unit 140 may have a power source (e.g., battery) in some embodiments. Additionally or alternatively, the re-bander unit may be powered by the UE 110. In either case, however, re-bander units 140 traditionally do not employ power savings features to control power consumption by power amplifiers and/or other circuitry of the re-bander units 140. Thus, for embodiments in which the re-bander unit 140 and/or UE 110 are powered by battery, use of the re-bander unit 140 may quickly deplete the battery.

With this in mind, embodiments described below provide power efficiency for re-bander units. In particular, embodiments provide operational power to a power amplifier in the transmit path of the re-bander on demand, when a transmit signal is to be transmitted. Circuitry controlling the powering up of the power amplifier may do so based on a transmit indicator signal, indicating the presence of a transmit signal received by the re-bander unit. The transmit indicator signal may be a strobe signal received by a user equipment (UE) to which the re-bander unit is coupled, or may be derived from detection of the transmit signal by a directional coupler and power detector. Additional details are provided below with reference to FIGS. 2-5.

Figure 2:
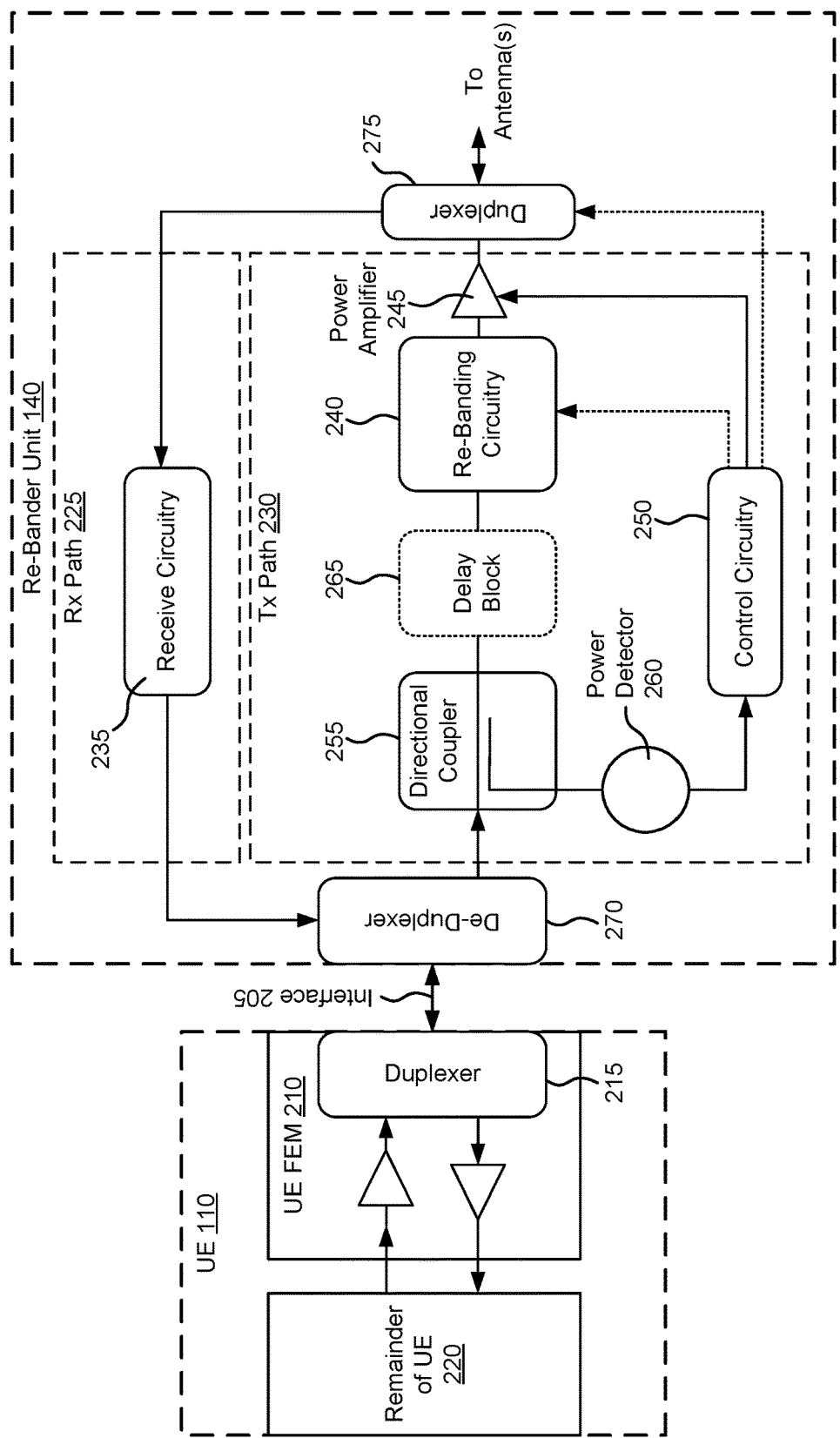
FIGS. 2-4 are block diagrams of embodiments of a re-bander unit communicatively connected to a user equipment (UE) via an interface.

FIG. 2 is a block diagram of an embodiment of a re-bander unit 140 communicatively connected to a UE 110 via an interface 205. As with other figures provided herein, FIG. 2 is provided as a non-limiting example. A person of ordinary skill in the art will appreciate the various components illustrated in FIG. 2 may be combined, separated, rearranged, and/or otherwise altered, depending on desired implementation. Here, the components of the UE 110 illustrated are simply shown as components within a UE Front-End Module 210 (which includes a duplexer 215 that combines send and receive signal paths at the interface 205) and the remainder of the UE 220, which includes the remainder of the components of the UE, including components generating a transmit signal or receiving a received signal.

Although labeled as a single interface 205 in FIG. 2, the UE 110 and the re-bander unit 140 may each have an interface for communicatively coupling with the other. As mentioned previously, the interface of the UE 110 may comprise an antenna port. And thus, the re-bander unit 140 may have an interface configured to couple to the antenna port of the UE 110. It can be further noted that the re-bander unit 140 may itself have an antenna port to allow the re-bander unit 140 to be coupled with one or more external antennas. In some embodiments, the re-bander unit 140 may additionally or alternatively have one or more internal antennas for communicating at the desired wireless communication frequency.

The re-bander unit 140 comprises various components divided into a receive path, Rx path 225, and a transmit path, Tx path 230. Here, the Rx path 225 includes receiving circuitry 235 configured to process a receive signal detected with the antenna(s) and output a re-banded receive signal by altering a received frequency (the wireless communication frequency) of the receive signal. Here, the re-banded receive signal output by the receive circuitry 235 is output in a UE communication frequency native to the UE 110, re-banded from a wireless communication frequency of a wireless signal (e.g., wireless signal 150 of FIG. 1).

According to some embodiments, the re-bander unit 140 may be used for military applications and may therefore comprise a military design meeting military-grade standards, thereby configured to withstand higher levels of physical impacts, temperature extremes, and/or other environmental hazards than a consumer device. Nonetheless, a consumer-grade design and/or design met to meet other standards may be used if so desired. It will be understood that the re-bander unit 140 may comprise other electrical components (e.g., a battery or other power source) not illustrated in FIG. 2.

The Tx path 230 includes re-banding circuitry 240 and power amplifier 245. According to the illustrated embodiment, to provide power efficiency, the Tx path 230 additionally includes control circuitry 250, a directional coupler 255, and a power detector 260. The Tx path 230 may optionally include a delay block 265 coupled between the directional coupler 255 and the re-banding circuitry 240. Additionally or alternatively to the illustrated delay block 265, a delay block may be located between the re-banding circuitry 240 in the power amplifier 245.

De-duplexer 270, and duplexer 275 are used to combine and separate Rx path 225 and Tx path 230, as needed. That is, de-duplexer 270 operates to route transmit signals received from the UE 110 at the interface 205 to the Tx path 230, and further operates to route an output of the receive circuitry 235 to the interface 205. Duplexer 275 is located on the other end of the Rx path 225 and Tx path 230, and operates to route a received signal from the antenna(s) to the receive circuitry 235, and route an amplified re-banded transmit signal from the power amplifier 245 to the antenna(s).

It can be noted that the functionality of the de-duplexer 270 and duplexer 275 may vary, based on whether the re-bander unit 140 is used for TDD or FDD communications. For FDD communications, for example, de-duplexer 270 and duplexer 275 may represent passive components that de-duplex and duplex RF paths passively. For TDD communications, de-duplexer 270 and duplexer 275 may operate to switch between transmit and receive functionality. According to some embodiments, de-duplexer 270 and/or duplexer 275 may default to a receive mode (respectively routing an output of the receive circuitry 235 to the UE 110 via the interface 205 and routing a received signal from the antenna(s) to the receive circuitry 235), switching to a transmit mode when transmitting a transmit signal. Additional details are provided herein below.

The power amplifier 245 can use a relatively large amount of power of the re-bander unit 140. With this in mind, the control circuitry 250, directional coupler 255, and power detector 260 can be used to power up the power amplifier 245 on an "as needed" basis. In other words, these components can determine when a transmit signal received from the UE 110 needs to be transmitted. More specifically, when the UE 110 provides the re-bander unit 140 with a transmit signal via the interface 205, the de-duplexer 270 will route the transmit signal to the Tx path 230.

The directional coupler 255 is configured to generate a detection signal by coupling the transmit signal to an input of the power detector 260. As a person of ordinary skill in the art will appreciate, coupling performed by the directional coupler 255 can be done in any of a variety of ways. Directional couplers may be purchased as discrete components from a variety of manufacturers. Alternatively, a directional coupler can be created on a substrate (e.g. printed circuit board (PCB)) using distributed element design, wherein, for example, conductive tracks are positioned appropriately, with respect to the conductive track propagating the transmit signal, to perform the coupling.

The power detector 260 is configured to, in response to receiving the detection signal, output an indicator signal to the control circuitry. This can mean changing the detection signal (a signal generated from the coupled the transmit signal) to a transmit indicator signal to alert the control circuitry 250 that a transmit signal has been detected in the Tx path 230. Thus, depending on the requirements of the control circuitry 250, the output signal provided by the power detector 260 may vary. For example, with the control circuitry 250 comprises a microprocessor, the output of the power detector 260 may comprise a logical one or zero. For example, the power detector 260 may comprise a comparator, or may comprise a "lock type" power detector with the binary output.

The control circuitry 250, which receives the transmit indicator signal provided by the power detector 260 at its input, generates an output signal for controlling the power of the power amplifier 245. Optionally, the control circuitry 250 may also control the power of the re-banding circuitry 240 and the switching of the duplexer 275 (in embodiments implementing TDD operation). The control circuitry 250 may comprise analog circuitry, which may include buffers to provide sufficient drive signal (e.g. to a comparator) or inverters (e.g., to flip logic) where needed. Alternatively, as indicated previously, the control circuitry may comprise a processor, such as a microprocessor or microcontroller having direct memory access (DMA) architecture. Where processor is used, the power detector 260 may provide an interrupt to an input of the control circuitry 250 comprising the processor, which may cause the processor to toggle an output at a General Purpose Input Output (GPIO), used to control the power to the power amplifier 245. In some embodiments, the control circuitry 250 and power detector 260 may be a single unit that receives an input from the directional coupler and provides an output to control the power of the power amplifier 245.

Meanwhile, the transmit signal continues to move through the Tx path 230 to an input of the re-banding circuitry 240 (which, in some embodiments, may involve propagating through the optional delay block 265, which may be used as described below). The re-banding circuitry 240 re-bands the transmit signal from the UE communication frequency (at which the transmit signal was provided to the re-bander unit 140 by the UE 110) to a wireless communication frequency for wireless transmission by antenna(s). In mind, the operation of the control circuitry 250, power detector 260, and directional coupler 255 is to detect a transmit signal and power up a power amplifier 245 (i.e., causing the power amplifier 245 to transition from an inactive state to an active state) prior to the power amplifier 245 receiving the re-banded transmit signal from the output of the re-banding circuitry 240.

The period of time from the detection the transmit signal with the directional coupler 255 to the activation of the power amplifier 245 can vary, depending on desired functionality. According to some embodiments, for example, this reaction time may be faster than a microsecond, and preferably faster than 100 ns or, in some embodiments, faster than 10 ns. These speeds are easily achievable by analog circuitry, but may also be achieved with control circuitry 250 comprising a processor (where hardware and/or software optimizations may be made to increase speed). Maintaining a fast reaction time can help reduce the likelihood of loss conductivity range and data throughput speeds due to the re-bander unit 140, thereby ensuring the re-bander unit 140 remains transparent to the UE 110.

To help ensure the speed at which the transmit signal is re-banded by the re-banding circuitry 240 and the re-banded transmit signal is provided to the power amplifier 245 is slower than the speed at which the transmit signal is detected and the control circuitry 250 activates the power amplifier 245, one or more delay blocks 265 may be utilized. As illustrated, a delay block 265 may be located in the Tx path 230 between the directional coupler 255 and the re-banding circuitry 240. Additionally or alternatively, a delay block 265 may be utilized between the output of the re-banding circuitry 240 in the input of the power amplifier 245.

As used herein, the term "active state" refers to a state in which the power amplifier 245 is able to amplify the re-banded transmit signal received from the output of the re-banding circuitry 240 for transmission by the antenna(s), in which case the power amplifier 245 will provide, at its output, an amplified re-banded transmit signal which is routed to the antenna(s) by the duplexer 275. Thus, the term "inactive state" refers to a state in which the power amplifier 245 is unable to do so. Naturally, the power amplifier 245 uses more power in the active state than in the inactive state. Thus, by causing the power amplifier 245 to enter an active state only when needed (e.g., when transmitting transmit signals received from the UE 110) the re-bander unit 140 is able to save a significant amount of power.

The control circuitry 250 may output an activation signal that may cause the power amplifier 245 to transition from an inactive state to an active state in any of a variety of ways. For example, as illustrated in FIG. 2, the power amplifier 245 may simply have an input that allows the output signal of the control circuitry 250 to activate the power amplifier 245 by, for example, providing a signal that causes the power amplifier 245 to awaken from a "sleep" state, causes the gain of the power amplifier 245 to be increased to an operable level, or the like. In some embodiments, as shown in FIG. 3, the activation signal provided by the control circuitry may cause power circuitry 310 controlling the power to the power amplifier 245 to activate the power amplifier 245 by providing power to the power amplifier 245. Such power circuitry may comprise, for example, a Low Drop Out (LDO) regulator or switcher (e.g., a Point Of Load (POL) DC-two-DC switcher).

The dynamic range of the power amplifier 245 can vary, and may be determined by the dynamic range of the UE, which may be governed by an underlying standard. For example, the current standard for LTE (as determined by the 3rd Generation Partnership Project (3GPP)) is 85 dB. To help ensure transparency of the re-bander unit 140, the dynamic range of the power amplifier 245 may be determined to be greater than 85 dB (e.g., 90 dB). In some embodiments, the dynamic range of the power amplifier may be determined to be a set amount greater than the requirements of the underlining governing standard (e.g., 5 dB greater, 10 dB greater, etc.) for transmitting wireless signals, to help ensure compatibility for future standards that may require greater dynamic range. That said, in some embodiments, the dynamic range of the power amplifier 245 may be less than the dynamic range of the UE 110.

Optionally, the control circuitry 250 may provide an output signal to the re-banding circuitry 240 and/or the duplexer 275. With regard to the re-banding circuitry 240, the output of the control circuitry 250 (e.g., a second activation signal) may be configured to cause the re-banding circuitry 240 to transform from an inoperable state to an operable state, in the same manner the control circuitry 250 activates the power amplifier 245. Here, the term "operable state" refers to a state in which the re-banding circuitry 240 is capable of re-banding a transmit signal from the UE communication frequency to the wireless communication frequency. The term "inoperable state" refers to a state in which the re-banding circuitry 240 is incapable of performing this re-banding. Similar to the output for the power amplifier 245, the output of the control circuitry 250 may cause the re-banding circuitry 240 to wake up from a sleep state, may control power circuitry 320 (see FIG. 3) that provides power to the re-banding circuitry 240, or the like, thereby providing additional power savings for the re-bander unit 140.

With regard to the duplexer 275, the control circuitry may be used in embodiments that provide TDD operability to switch the duplexer 275 from a receive mode to a transmit mode. More specifically, the control circuitry 250 can provide an activation signal that cause the duplexer to route the output of the power amplifier 245 to the antenna(s) (e.g., by activating a switch or circulator within the duplexer 275) to be able to transmit the amplified re-banded transmit signal. After routing the signal, the duplexer 275 may revert back to the receive mode, in which receive signals are routed from the antenna(s) to the receive circuitry 235.

It can be noted that, according to some embodiments, activation signals provided by the control circuitry 250 to the re-banding circuitry 240, power amplifier 245, and duplexer 275 may be generated by single source (e.g. a single output of a processing unit) and routed separately to the various components, depending on the necessary inputs for the various components. Buffers and/or inverters may additionally be used to adjust the signal as needed, based on the input requirements for the different components.

It can be further that noted that some UEs 110 may be capable of providing signals indicative of the UE 110 sending the re-bander unit 140 a transmit signal. These signals may be used in lieu of circuitry designed to detect the transmit signal within the Tx Path 230 of the re-bander unit 140. One such embodiment is illustrated in FIG. 4.

Figure 3:
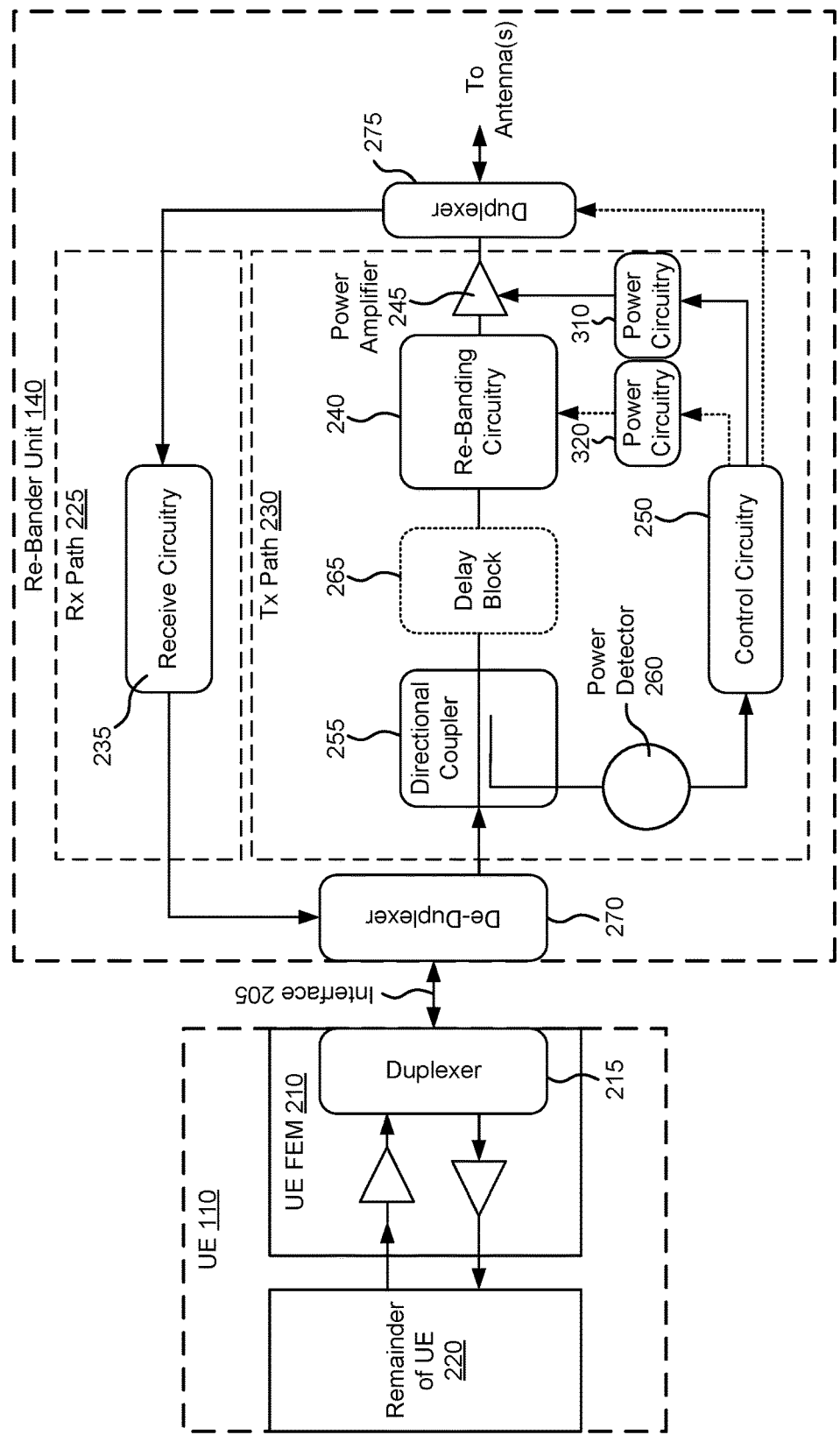
Figure 4:
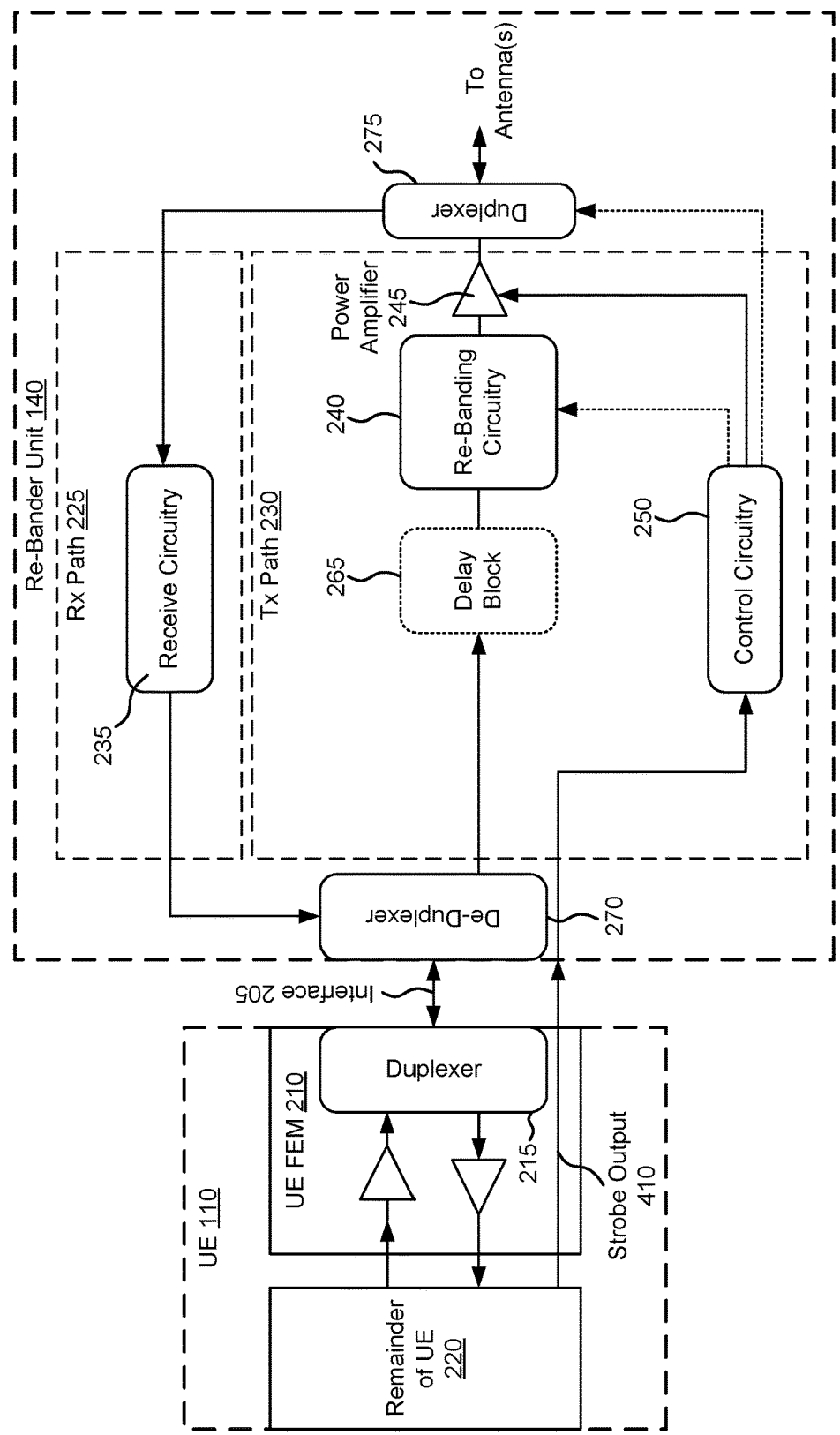

FIG. 4 is a block diagram illustrating the re-bander unit 140 and UE 110, similar to FIGS. 2-3, according to an alternative embodiment. Here, the UE 110 provides an additional strobe output 410 that provides a "strobe" signal, which accompanies the receipt of the transmit signal by the re-bander unit 140 from the UE 110. (Operationally, a strobe signal is typically used to illuminate an LED to notify user when the UE 110 is transmitting signals.) Thus, the embodiment of the re-bander unit 140 illustrated in FIG. 4 does not include a directional coupler 255 or power detector 260 in the Tx path 230 for detecting a transmit signal routed to the re-banding circuitry 240. Instead, the strobe signal is routed directly to the control circuitry 250. (It can be noted, however, that the input of the control circuitry 250 may include buffers, inverters, etc. to provide the appropriate signal needed to generate an activation signal to activate the power amplifier 245 (and optional activation signals for the re-banding circuitry 240 and/or duplexer 275). As indicated in FIG. 4, a delay block 265 optionally may be included in the Tx path 230, coupled between the input of the re-banding circuitry 240 and output of the de-duplexer 270 as illustrated and/or coupled between the output of the re-banding circuitry 240 in the input of the power amplifier 245. Such delay blocks 265 can be used in embodiments where the transmit signal would otherwise reach the power amplifier 245 (after being re-banded by the re-banding circuitry 240) prior to the control circuitry 250 activating the power amplifier 245. Alternative embodiments may include additional or alternative circuitry to help ensure that the power amplifier 245 is activated (in response to the control circuitry 250 receiving the strobe signal) prior to receiving the re-banded transmit signal from the re-banding circuitry 240.

Figure 5:
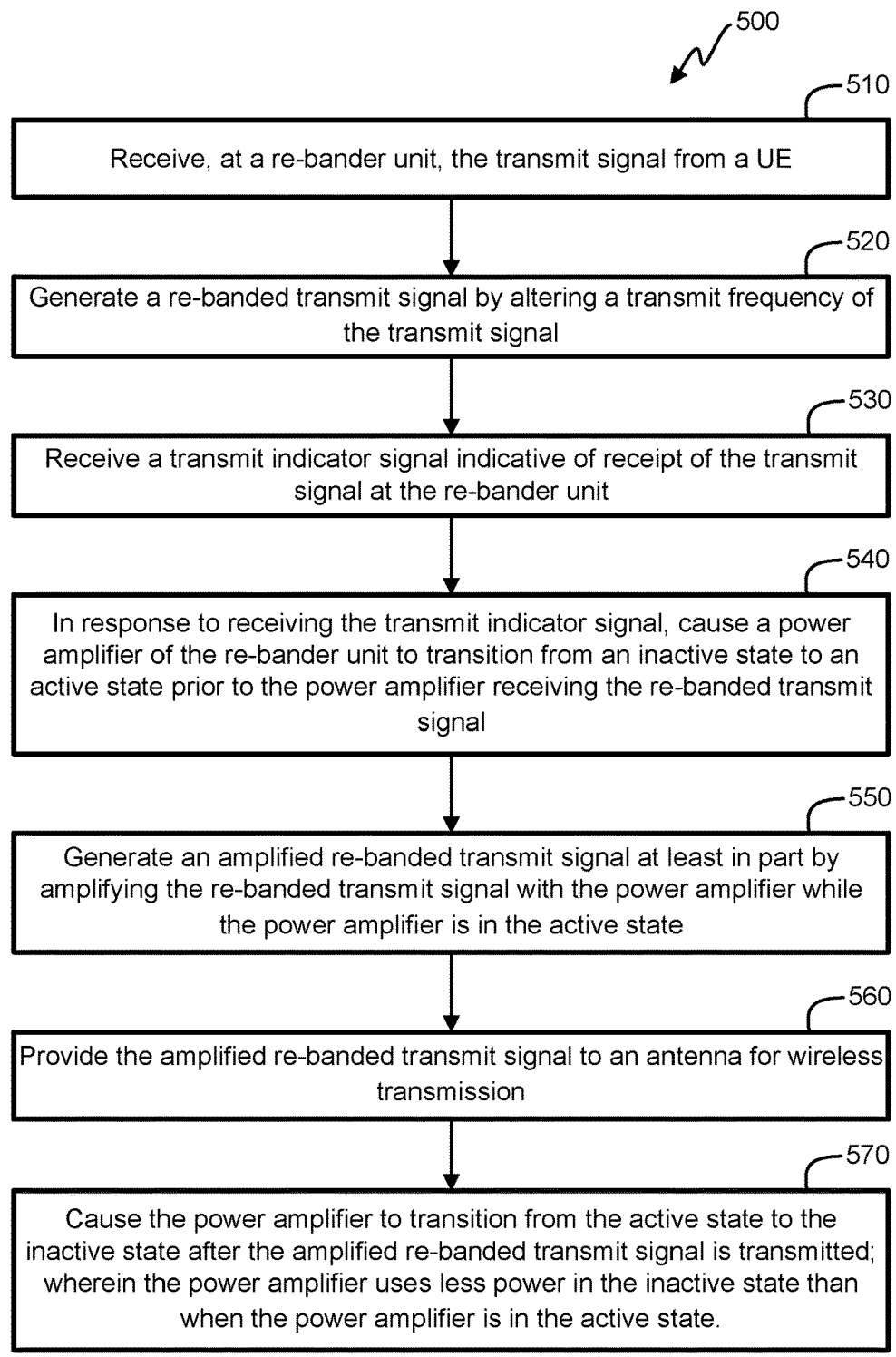
FIG. 5 is a flow diagram, illustrating a method of performing power-efficient frequency re-banding of a transmit signal, according to an embodiment.

FIG. 5 is a flow diagram, illustrating a method of performing power-efficient frequency re-banding of a transmit signal, according to an embodiment. The method 500 can be implemented by re-bander unit 140 as described in the embodiments above and illustrated in FIGS. 2-4, for example. As such, means for performing one or more of the functions illustrated in the various blocks of FIG. 5 may comprise hardware and/or software components of a re-bander unit 140. As with other figures herein, FIG. 5 is provided as an example. Other embodiments may vary in functionality from the functionality shown. Variations may include performing additional functions, substituting functions, performing functions in a different order or simultaneously, and the like.

The functionality at block 510 comprises receiving, at a re-bander unit, the transmit signal from a UE. As previously explained, the transmit signal may comprise a signal provided by the UE via an antenna port to the re-bander unit. The transmit signal may therefore comprise a signal having a UE communication frequency (i.e., a communication frequency in which the UE natively communicates).

At block 520, the functionality includes generating a re-banded transmit signal by altering the transmit frequency of the transmit signal. As described in the embodiments detailed above, a de-duplexer may route the transmit signal to a Tx path within the re-bander unit that has re-banding circuitry used to re-band the transmit signal. The communication frequency of the transmit signal is then re-banded to a wireless communication frequency different than the UE communication frequency of the transmit signal received at block 510.

At block 530, the functionality includes receiving a transmit indicator signal indicative of receipt of the transmit signal at the re-bander unit. As explained above, where a UE provides a strobe signal in conjunction with the transmit signal, some embodiments may provide for using the strobe signal as the transmit indicator signal. Alternatively, the transmit indicator signal may be generated within the re-bander unit itself. This can be done first by generating, with a directional coupler of the re-band are unit, a detection signal in response to detecting the transmit signal at the re-bander unit. Then, in response to receiving the detection signal at a power detector of the re-bander unit, the transmit indicator signal may then be generated with the power detector.

At block 540, the functionality includes, in response to receiving the transmit indicator signal, causing a power amplifier of the re-bander unit to transition from an inactive state to inactive state prior to the power amplifier receiving the re-banded transmit signal. As discussed in detail above, causing the power amplifier to transition from an inactive state to an active state may comprise causing again increase of the power amplifier, providing an enable signal at an enable input of the power amplifier, and/or causing power circuitry to provide power to the power amplifier. Analog circuitry and/or a processor may be utilized to receive the transmit indicator signal and provide an activation signal to activate the power amplifier. To help ensure the power amplifiers activated on time, the method may further comprise using one or more delay blocks to delay the transmit signal, delay the re-banded transmit signal, or both.

At block 550, and amplified re-banded transmit signal is generated at least in part by amplifying the re-banded transmit signal with the power amplifier while the power amplifier is in an active state. And at block 560, the amplified re-banded transmit signals provided to an antenna for wireless transmission. As noted previously the antenna may be disposed within the re-bander unit, or may be a separate component. (The re-bander unit itself may have an antenna port.)

At block 570, the method includes causing the power amplifier to transition from the active state to the inactive state after the amplified re-banded transmit signal is transmitted, where the power amplifier uses less power in the inactive state and when the power amplifier is in the active state. The functionality of this block can help ensure power savings of the re-bander unit when the re-bander unit is not being used to for transmitting signals received from the UE.

As noted in the embodiments above, alternative embodiments may include a variety of additional features. For example, in some embodiments, the re-bander unit comprises re-banding circuitry that generates the re-banded transmit signal. In such embodiments, the method 500 may further comprise, in response to receiving the transmit indicator signal, causing the re-banding circuitry to transition from an inoperable state to an operable state. Here, the re-banding circuitry generates the re-banded transmit signal while in the operable state, transitions from the operable state to the inoperable state after the re-banded transmit signals generated, and uses less power in the inoperable state than when the re-banding circuitry is in the operable state.

Embodiments may further include a duplexer that duplexes signals from the Rx and Tx paths of the re-bander unit, routing them from and to the antenna respectively. Accordingly, some embodiments may further comprise receiving received signal detected with the antenna, generating a re-banded receive signal by altering the received frequency from the received signal. And routing the re-banded received signal to the UE. Here, the re-bander unit operates in reverse, re-banding received signals having a wireless communication frequency to the UE communication frequency native to the UE. Control of the duplexer may also be responsive to the transmit indicator signal. Thus, according to some embodiments, the method may further comprise, in response to receiving the transmit indicator signal, causing a duplexer of the re-bander unit to switch from a received mode to a transmit mode, where the duplexer is configured to route the amplified re-banded transmit signal from the power amplifier to the antenna while in the transmit mode, and switch from the transmit mode to the received mode after routing the amplified re-banded transmit signal to the antenna.

Finally, embodiments of the method 500 may also provide for the re-bander unit having a de-duplexer at the interface with the UE that switches between a transmit mode or receive mode to provide TDD operability. In such embodiments, the de-duplexer routes a re-banded receive signal to the UE while in the received mode, routes the transmit signal to the re-banding circuitry of the re-bander unit while in the transmit mode, and switches from the transmit mode to the received mode after routing the transmit signal to the re-banding circuitry.

Various components may be described herein as being "configured" to perform various operations. Those skilled in the art will recognize that, depending on implementation, such configuration can be accomplished through design, setup, placement, interconnection, and/or programming of the particular components and that, again depending on implementation, a configured component might or might not be reconfigurable for a different operation. Moreover, for many functions described herein, specific means have also been described as being capable of performing such functions. It can be understood, however, that functionality is not limited to the means disclosed. A person of ordinary skill in the art will appreciate that alternative means for performing similar functions may additionally or alternatively be used to those means described herein.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

With reference to the appended figures, components that may comprise memory may comprise non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including but not limited to, non-volatile media, volatile media, and transmission media. Common forms of computer-readable media include, for example, magnetic and/or optical media, any other physical medium, a RAM, a PROM, EPROM, a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

Some portions of the detailed description included herein are presented in terms of algorithms or symbolic representations of operations on binary digital signals, which may be stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter.

The terms "and," "or," and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

Therefore, it is intended that claimed subject matter not be limited to the particular examples disclosed, but that such claimed subject matter may also include all aspects falling within the scope of appended claims, and equivalents thereof

What is claimed is:

1. A frequency re-bander unit comprising:
    an interface configured to receive a transmit signal from a user equipment (UE);
    re-banding circuitry comprising:
        an input configured to receive the transmit signal from the interface, and
        an output configured to provide a re-banded transmit signal by altering a transmit frequency of the transmit signal;
    control circuitry comprising:
        an input configured to receive a transmit indicator signal indicative of receipt of the transmit signal from the UE at the interface, and
        an output configured to provide, in response to receiving the transmit indicator signal, an activation signal configured to cause a power amplifier to transition from an inactive state to an active state; and
    the power amplifier comprising:
        an input coupled with an output of the re-banding circuitry and configured to receive, while in the active state, the re-banded transmit signal, and
        an output configured to provide, while in the active state, an amplified re-banded transmit signal for wireless transmission by an antenna;
    wherein the power amplifier is configured to:
        transition from the active state to the inactive state after the amplified re-banded transmit signal is transmitted, and
        use less power in the inactive state than when the power amplifier is in the active state.

2. The frequency re-bander unit of claim 1, wherein the control circuitry is configured to receive the transmit indicator signal from the UE, the transmit indicator signal comprising a strobe signal.

3. The frequency re-bander unit of claim 1, further comprising:
    a directional coupler coupled between the interface and the re-banding circuitry and configured to detect the transmit signal, wherein the directional coupler comprises an output configured to provide, in response to detecting the transmit signal, a detection signal; and
    power detector circuitry, coupled between the directional coupler and the input of the control circuitry, the power detector circuitry comprising:
        an input configured to receive the detection signal, and
        an output configured to provide the transmit indicator signal to the control circuitry in response to receiving the detection signal.

4. The frequency re-bander unit of claim 1, wherein the activation signal is configured to cause the power amplifier to transition from the inactive state to the active state at least in part by:
    causing a gain increase of the power amplifier,
    providing an enable signal at an enable input of the power amplifier, or
    causing power circuitry to provide power to the power amplifier, or
    any combination thereof.

5. The frequency re-bander unit of claim 1, wherein the control circuitry comprises a processor.

6. The frequency re-bander unit of claim 1, further comprising:
a first delay block coupled between the interface and the input of the re-banding circuitry, wherein the first delay block is configured to delay the receipt of the transmit signal at the input of the re-banding circuitry; or
a second delay block coupled between the output of the re-banding circuitry and the input of the power amplifier, where the second delay block is configured to delay the receipt of the re-banded transmit signal at the input of the power amplifier; or
both.

7. The frequency re-bander unit of claim 1, wherein:
the control circuitry further comprises a second output configured to provide, in response to receiving the transmit indicator signal, a second activation signal configured to cause the re-banding circuitry to transition from an inoperable state to an operable state; and
the re-banding circuitry is configured to:
provide the re-banded transmit signal at the output of the re-banding circuitry while in the operable state,
transition from the operable state to the inoperable state after the re-banded transmit signal is provided, and
use less power in the inoperable state than when the re-banding circuitry is in the operable state.

8. The frequency re-bander unit of claim 1, further comprising:
receive circuitry comprising:
an input configured to receive a receive signal detected with the antenna, and
an output configured to provide a re-banded receive signal by altering a received frequency of the received signal;
a de-duplexer coupled with the interface, the output of the receive circuitry, and the input of the re-banding circuitry, wherein the de-duplexer is configured to:
route the re-banded receive signal to the UE via the interface, and
route the transmit signal, received from the UE at the interface, to the input of the re-banding circuitry; and
a duplexer coupled with an antenna, the output of the power amplifier, and the input of the receive circuitry, wherein the duplexer is configured to:
route the receive signal from the antenna to the input of the receive circuitry, and
route the amplified re-banded transmit signal from the output of the power amplifier to the antenna.

9. The frequency re-bander unit of claim 8, wherein:
the duplexer is configured to switch between a transmit mode or receive mode to provide Time Division Duplex (TDD) operability;
the control circuitry further comprises a second output configured to provide, in response to receiving the transmit indicator signal, a second activation signal configured to cause the duplexer to switch from the receive mode to a transmit mode; and
the duplexer is configured to:
route the amplified re-banded transmit signal from the output of the power amplifier to the antenna while in the transmit mode, and
switch from the transmit mode to the receive mode after routing the amplified re-banded transmit signal to the antenna.

10. The frequency re-bander unit of claim 8, wherein the de-duplexer is configured to switch between a transmit mode or receive mode to provide TDD operability such that the de-duplexer:
routes the re-banded receive signal to the UE via the interface while in the receive mode,
routes the transmit signal to the input of the re-banding circuitry while in the transmit mode, and
switches from the transmit mode to the receive mode routing the transmit signal to the input of the re-banding circuitry.

11. A method of performing power-efficient frequency re-banding of a transmit signal, the method comprising:
receiving, at a re-bander unit, the transmit signal from a user equipment (UE);
generating a re-banded transmit signal by altering a transmit frequency of the transmit signal;
receiving a transmit indicator signal indicative of receipt of the transmit signal at the re-bander unit;
in response to receiving the transmit indicator signal, causing a power amplifier of the re-bander unit to transition from an inactive state to an active state prior to the power amplifier receiving the re-banded transmit signal;
generating an amplified re-banded transmit signal at least in part by amplifying the re-banded transmit signal with the power amplifier while the power amplifier is in the active state;
providing the amplified re-banded transmit signal to an antenna for wireless transmission; and
causing the power amplifier to transition from the active state to the inactive state after the amplified re-banded transmit signal is transmitted, wherein the power amplifier uses less power in the inactive state than when the power amplifier is in the active state.

12. The method of claim 11, wherein the transmit indicator signal comprises a strobe signal received by the re-bander unit from the UE.

13. The method of claim 11, further comprising:
generating, with a directional coupler of the re-bander unit, a detection signal in response to detecting the transmit signal at the re-bander unit; and
in response to receiving the detection signal at a power detector of the re-bander unit, generating the transmit indicator signal with the power detector.

14. The method of claim 11, wherein causing a power amplifier of the re-bander unit to transition from an inactive state to an active state comprises causing the power amplifier to transition from the inactive state to the active state at least in part by:
causing a gain increase of the power amplifier,
providing an enable signal at an enable input of the power amplifier, or
causing power circuitry to provide power to the power amplifier, or
any combination thereof.

15. The method of claim 11, further comprising causing the power amplifier of the re-bander unit to transition from an inactive state to an active state using a processor.

16. The method of claim 11, further comprising using one or more delay blocks to:
delay the transmit signal; or
delay the re-banded transmit signal; or
both.

17. The method of claim 11, wherein:
the re-bander unit comprises re-banding circuitry that generates the re-banded transmit signal; and
the method further comprises, in response to receiving the transmit indicator signal, causing the re-banding circuitry to transition from an inoperable state to an operable state; and wherein the re-banding circuitry:
  generates the re-banded transmit signal while in the operable state,
  transitions from the operable state to the inoperable state after the re-banded transmit signal is generated, and
  uses less power in the inoperable state than when the re-banding circuitry is in the operable state.

18. The method of claim 11, further comprising:
receiving a receive signal detected with the antenna;
generating a re-banded receive signal by altering a received frequency of the received signal; and
routing the re-banded receive signal to the UE.

19. The method of claim 11, further comprising, in response to receiving the transmit indicator signal, causing a duplexer of the re-bander unit to switch from a receive mode to a transmit mode; wherein the duplexer is configured to:
  route the amplified re-banded transmit signal from the power amplifier to the antenna while in the transmit mode, and
  switch from the transmit mode to the receive mode after routing the amplified re-banded transmit signal to the antenna.

20. The method of claim 11, wherein the re-bander unit further comprises a de-duplexer that switches between a transmit mode or receive mode to provide TDD operability such that the de-duplexer:
  routes a re-banded receive signal to the UE while in the receive mode,
  routes the transmit signal to re-banding circuitry of the re-bander unit while in the transmit mode, and
  switches from the transmit mode to the receive mode after routing the transmit signal to the re-banding circuitry.

* * * * *